United States Patent
Okubo et al.

(10) Patent No.: US 10,461,656 B2
(45) Date of Patent: Oct. 29, 2019

(54) POWER CONVERSION DEVICE HAVING A COVER THAT COVERS DC POSITIVE AND NEGATIVE TERMINALS

(71) Applicant: Hitachi Automotive Systems, Ltd., Hitachinaka-shi, Ibaraki (JP)

(72) Inventors: Yutaka Okubo, Hitachinaka (JP); Kaname Sasaki, Hitachinaka (JP); Satoru Shigeta, Hitachinaka (JP); Kenichirou Nakajima, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 75 days.

(21) Appl. No.: 15/515,450

(22) PCT Filed: Sep. 18, 2015

(86) PCT No.: PCT/JP2015/076602
§ 371 (c)(1),
(2) Date: Mar. 29, 2017

(87) PCT Pub. No.: WO2016/080068
PCT Pub. Date: May 26, 2016

(65) Prior Publication Data
US 2017/0222570 A1    Aug. 3, 2017

(30) Foreign Application Priority Data
Nov. 18, 2014  (JP) .................................. 2014-233222

(51) Int. Cl.
*H02M 7/217* (2006.01)
*H02M 7/00* (2006.01)
(Continued)

(52) U.S. Cl.
CPC ............. *H02M 7/003* (2013.01); *H02M 1/08* (2013.01); *H02M 7/44* (2013.01); *H05K 5/03* (2013.01);
(Continued)

(58) Field of Classification Search
CPC .......... H02M 7/003; H02M 7/44; H02M 1/08; H02M 7/217; H02M 7/2173; H05K 5/03;
(Continued)

(56) References Cited

U.S. PATENT DOCUMENTS

| 6,275,003 B1 | 8/2001 | Marukawa et al. |
| 8,946,567 B2 * | 2/2015 | Nakatsu .................. B60L 11/14 174/547 |

(Continued)

FOREIGN PATENT DOCUMENTS

| JP | 7-151561 A | 6/1995 |
| JP | 2001-57196 A | 2/2001 |

(Continued)

OTHER PUBLICATIONS

International Search Report (PCT/ISA/210) issued in PCT Application No. PCT/JP2015/076602 dated Dec. 28, 2015 with English-language translation (five (5) pages).

(Continued)

*Primary Examiner* — Yemane Mehari
(74) *Attorney, Agent, or Firm* — Crowell & Moring LLP

(57) ABSTRACT

An object of the invention is to provide a power conversion device which secures insulation and is miniaturized still more without being affected by electromagnetic noises. A power conversion device according to the invention includes a power semiconductor module which converts a DC current into an AC current and includes a DC positive terminal and a DC negative terminal, and a resin cover portion which includes an insulating portion disposed between the DC (Continued)

positive terminal and the DC negative terminal. The cover portion holds a metal member which covers the DC positive terminal and the DC negative terminal.

5 Claims, 8 Drawing Sheets

(51) Int. Cl.
*H02M 1/08* (2006.01)
*H02M 7/44* (2006.01)
*H05K 5/03* (2006.01)
*H05K 7/20* (2006.01)
*H05K 7/14* (2006.01)

(52) U.S. Cl.
CPC ......... *H05K 7/1432* (2013.01); *H05K 7/2089* (2013.01)

(58) Field of Classification Search
CPC .. H05K 7/1432; H05K 7/2089; H03K 17/687; H03K 17/693; Y02B 70/1466; Y02B 70/1475
USPC .......... 363/131, 132, 126, 131.132; 174/520, 174/547; 318/400.01, 400.24, 400.25, 318/400.26, 700; 361/688, 700, 730, 820
See application file for complete search history.

(56) References Cited

U.S. PATENT DOCUMENTS

| | | | |
|---|---|---|---|
| 9,054,628 B2* | 6/2015 | Numakura | B60L 3/003 |
| 2001/0049055 A1 | 12/2001 | Saito | |
| 2005/0223727 A1 | 10/2005 | Funahashi et al. | |
| 2011/0249421 A1* | 10/2011 | Matsuo | B60K 6/445 361/821 |
| 2011/0299265 A1* | 12/2011 | Nakatsu | B60L 11/14 361/820 |
| 2013/0094269 A1 | 4/2013 | Maeda et al. | |
| 2013/0128643 A1 | 5/2013 | Shinohara et al. | |
| 2015/0163962 A1* | 6/2015 | Suzuki | H02M 7/003 361/699 |
| 2015/0214857 A1* | 7/2015 | Kosuga | H02M 7/003 318/400.26 |

FOREIGN PATENT DOCUMENTS

| | | |
|---|---|---|
| JP | 2001-332235 A | 11/2001 |
| JP | 2003-324903 A | 11/2003 |
| JP | 2009-130177 A | 6/2009 |
| JP | 2009-211827 A | 9/2009 |
| JP | 2011-217550 A | 10/2011 |
| JP | 2013-55298 A | 3/2013 |
| JP | 2013-255424 A | 12/2013 |
| JP | 5563383 B2 | 7/2014 |
| JP | 2014-171343 A | 9/2014 |
| WO | WO 2014/136354 A1 | 9/2014 |

OTHER PUBLICATIONS

Japanese-language Written Opinion (PCT/ISA/237) issued in PCT Application No. PCT/JP2015/076602 dated Dec. 28, 2015 (four (4) pages).

Japanese-language Office Action issued in counterpart Japanese Application No. 2016-560097 dated Jan. 8, 2019 with English translation (nine (9) pages).

* cited by examiner

ND NEGATIVE TERMINALS

TECHNICAL FIELD

The present invention relates to a power conversion device which converts DC power into AC power or vice versa, and particularly to a power conversion device which is suitable to be mounted in a vehicle.

BACKGROUND ART

As a hybrid automobile or an electric automobile is miniaturized, there is a request for miniaturization of a power conversion device used in these vehicles. Therefore, the power conversion device can be miniaturized by reducing dead spaces by miniaturizing components such as a power semiconductor module used in the power conversion device, and by closely disposing the components (for example, a circuit board and the power semiconductor module are closely disposed).

However, in a case where the components are miniaturized and closely disposed, particularly the power-supplied members are necessarily prevented from an erroneous operation of the power conversion device and a risk of an electric shock, and necessarily formed and disposed in consideration of an influence of an electromagnetic noise and an insulating distance. PTL 1 discloses a structure in which a layout distance between a circuit board and the power semiconductor module is increased in order to secure the insulating distance.

However, assuming the mounting on a vehicle, there is a need to achieve miniaturization and space saving by reducing the height of the back surface of a housing for example.

CITATION LIST

Patent Literature

PTL 1: JP 5563383 B2

SUMMARY OF INVENTION

Technical Problem

An object of the invention is to provide a power conversion device which secures insulation and is miniaturized still more without being affected by electromagnetic noises.

Solution to Problem

A power conversion device according to the invention includes a power semiconductor module which converts a DC current into an AC current and includes a DC positive terminal and a DC negative terminal, and a resin cover portion which includes an insulating portion disposed between the DC positive terminal and the DC negative terminal. The cover portion holds a metal member which covers the DC positive terminal and the DC negative terminal.

Advantageous Effects of Invention

According to the invention, a power semiconductor module mounted in a power conversion device and a circuit board can be disposed closely, and the power conversion device can be miniaturized by lowering the height of the back surface.

DESCRIPTION OF EMBODIMENTS

Hereinafter, embodiments of a power conversion device according to the invention will be described with reference to the drawings. Further, the same components in the respective drawings will be denoted with the same symbols, and the redundant description will be omitted.

A power conversion device 100 according to this embodiment is mainly used in a hybrid automobile and an electric automobile. An example of such a vehicle system is disclosed in JP 2011-217550 A. Further, the power conversion device 100 according to this embodiment may be used in other usage in order to achieve the effect. For example, the power conversion device maybe used in a household inverter of a refrigerator or an air conditioner for the purpose of improving productivity and cooling performance. In addition, the power conversion device may be used in an industrial inverter of which the usage environment is similarly to that of an inverter for vehicles.

Figure 2:
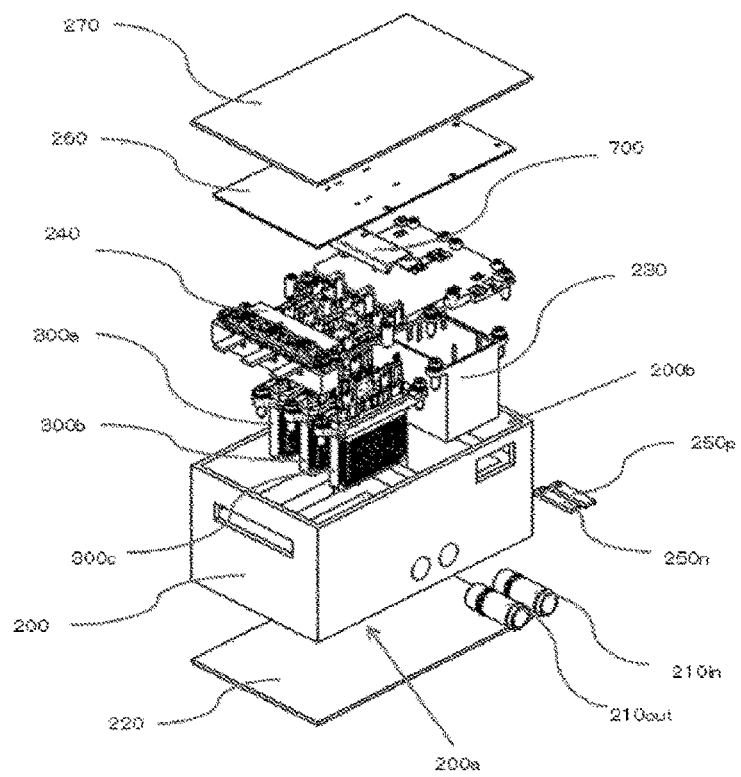
FIG. 2 is an exploded perspective view of components for describing the entire configuration of the power conversion device 100 illustrated in FIG. 1.

FIG. 2 is an exploded perspective view of the components for describing the entire configuration of the power conversion device 100 according to this embodiment.

The power conversion device 100 includes a housing case 200, a coolant inflow pump 210in, an coolant outflow pump 210out, a housing lower cover 220, a capacitor module 230, power semiconductor modules 300a to 300c, a mold bus bar 240 which contains a current sensor, an AC-power bus bar, a DC positive-electrode bus bar, and a DC negative-electrode bus bar, DC-power input bus bars 250p and 250n, a control-driver circuit board 260, and a housing upper cover 270.

The housing case 200 is made of an aluminum alloy for example, and has a box-shaped cuboid which has a pair of short-side wall portions and long-side wall portions. In addition, the housing case 200 stores the capacitor module 230, the power semiconductor modules 300a to 300c, the mold bus bar 240, the DC-power input bus bars 250p and 250n, and the control-driver circuit board 260.

The coolant inflow pump 210in and the coolant outflow pump 210out are inserted to the housing case 200, and a coolant is leaked in and out.

The housing lower cover 220 is assembled to cover a lower surface 200a of the housing case. In addition, the housing upper cover 270 is assembled to cover an upper surface 200b of the housing case after the respective components are stored in the housing case 200. A cover portion 700 is disposed on an upper side of the power semiconductor modules 300a to 300c.

The power semiconductors 300a to 300c used in the power conversion device will be described using FIGS. 3 to 5. All of the power semiconductors 300a to 300c have the same configuration, and the structure of the power semiconductor 300a will be described as a representative.

Figure 3A:
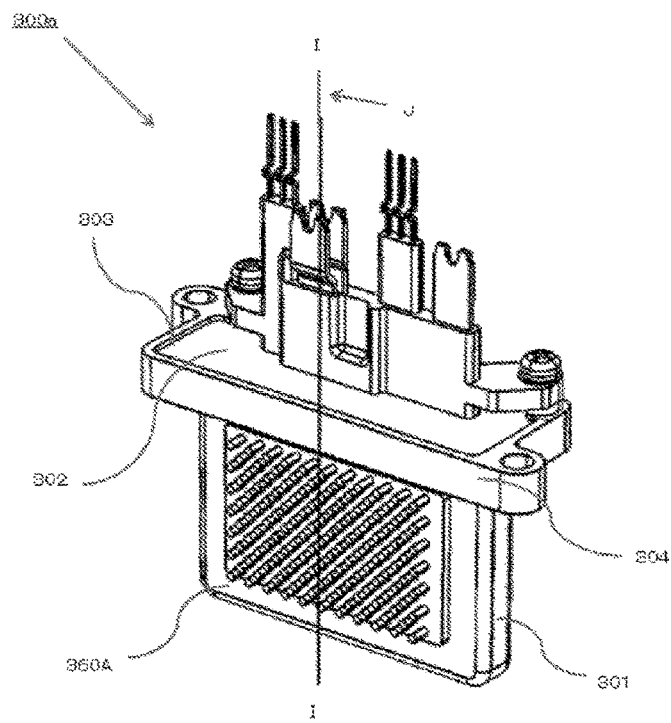
FIG. 3A is a perspective view of a power semiconductor module 300*a*.
Figure 3B:
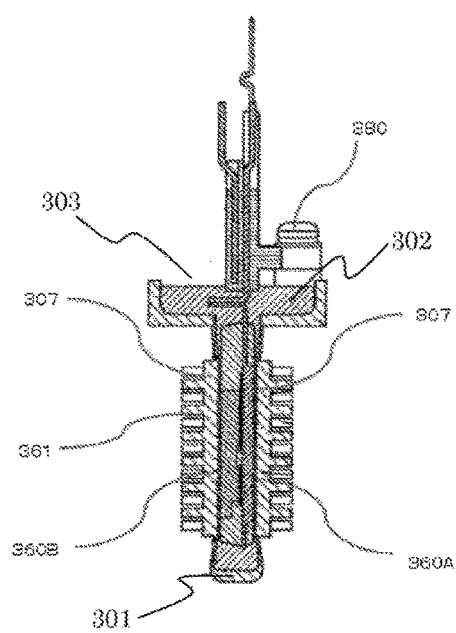
FIG. 3B is a cross-sectional view taken along a line I-I illustrated in FIG. 3A when viewed from a direction J.
Figure 4A:
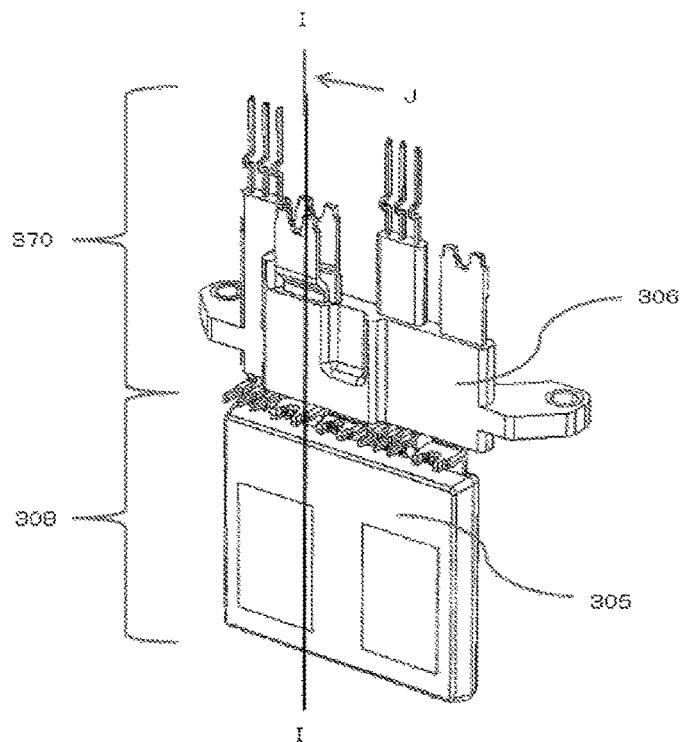
FIG. 4A is a perspective view illustrating the power semiconductor module 300*a* in which a module case 301, a second sealing resin 302, and an insulating member 307 are removed from the state illustrated in FIG. 3A.
Figure 4B:
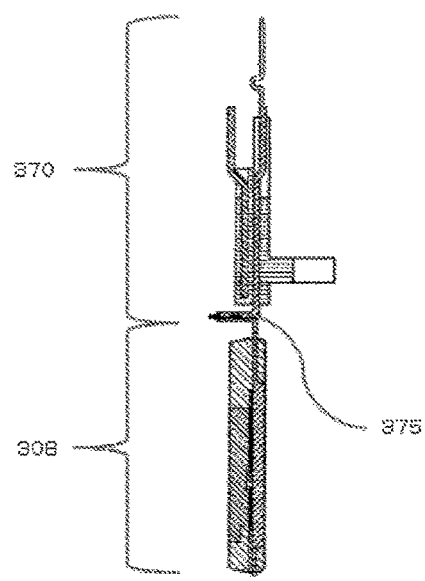
FIG. 4B is a cross-sectional view taken along a line I-I illustrated in FIG. 4A when viewed from the direction J.

FIG. 3(a) is a perspective view of the power semiconductor module 300a of this embodiment. FIG. 3(b) is a cross-sectional view of the power semiconductor module 300a of this embodiment taken along a line I-I illustrated in FIG. 3(a) when viewed from a direction J. FIG. 4(a) is a perspective view illustrating the power semiconductor module 300a in which a module case 301, a second sealing resin 302, and an insulating member 307 are removed from the state illustrated in FIG. 3(a). FIG. 4(b) is a cross-sectional view taken along a line I-I illustrated in FIG. 4(a) when viewed from the direction J. FIG. 5 is a perspective view illustrating the power semiconductor module 300a in which a first sealing resin 305 and a terminal insulating portion 306 are removed from the state illustrated in FIG. 4(a). FIG. 6 is a perspective view illustrating the power semiconductor module 300a in which a conductor plate 320 and a conductor plate 321 are removed from the state illustrated in FIG. 5.

As illustrated in FIG. 6, the power semiconductor elements (an IGBT 310, an IGBT 311, a diode 312, and a diode 313) forming a serial circuit of upper and lower arms are interposed by the conductor plates 320, 321, 322, and 323, and are fixed to the conductor plates 320 to 323 by a solder material. The IGBT 310 and the diode 312 form the upper arm, and the IGBT 311 and the diode 313 form the lower arm.

Figure 5:
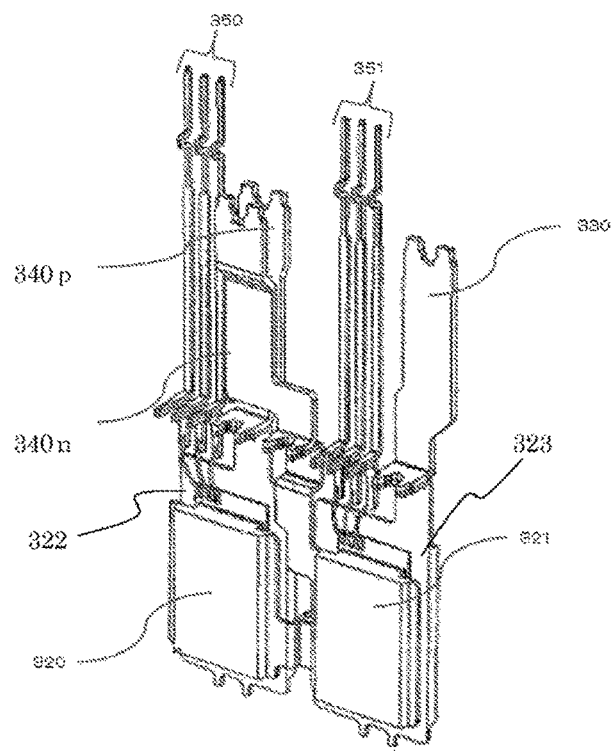
FIG. 5 is a perspective view illustrating the power semiconductor module 300a in which a first sealing resin 305 and a terminal insulating portion 306 are removed from the state illustrated in FIG. 4A.
Figure 6:
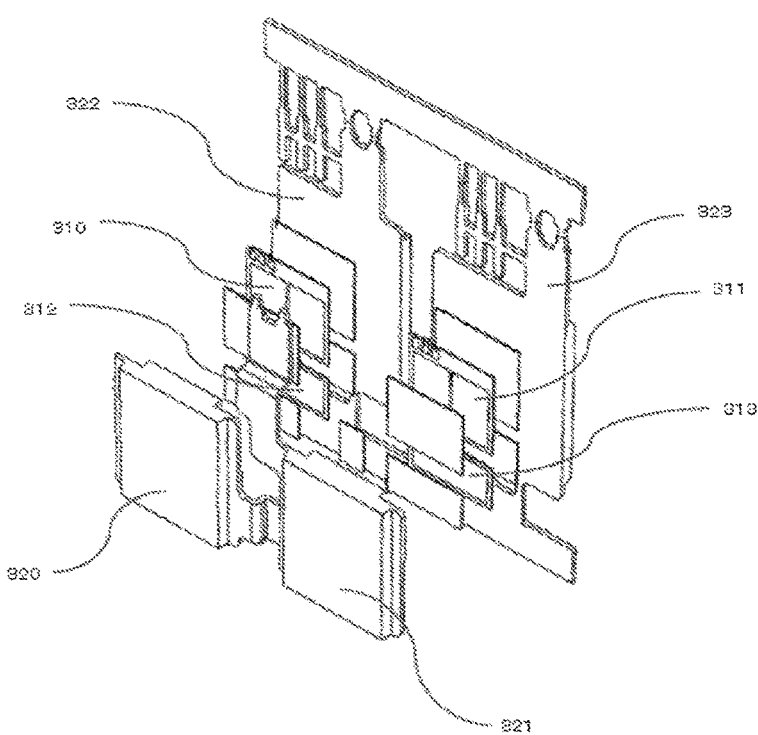
FIG. 6 is a perspective view illustrating the power semiconductor module 300a in which a conductor plate 320 and a conductor plate 321 are removed from the state illustrated in FIG. 5.

As illustrated in FIG. 5, an AC terminal 330 is connected to the conductor plate 323, a DC positive terminal 340p is connected to the conductor plate 322, and a DC negative terminal 340n is connected to the conductor plate 321.

As illustrated in FIG. 4(a), the conductor plates 320 to 323 are sealed by the first sealing resin 305 in a state where the heat radiation surface is exposed. The first sealing resin 305 has a polyhedron shape.

As illustrated in FIG. 3(b), a primary sealing body 308 (see FIG. 4(a)) sealed by the first sealing resin 305 is inserted into the module case 301 and interposes the insulating member 307 so as to be thermally pressed to the inner surface of the module case 301 which serves as a CAN-type cooler. Herein, the CAN-type cooler is a cylindrical cooler which includes an insertion hole 303 in one surface and the bottom in the other surface as illustrated in FIG. 3(a). A gap left inside the module case 301 is filled with the second sealing resin 302.

The module case 301 includes a conductive member (for example, an aluminum alloy material of Al, AlSi, AlSiC, or Al—C). The insertion hole 303 is configured such that the outer periphery is surrounded by a flange 304. In addition, as illustrated in FIGS. 3(a) and 3(b), a first heat radiation surface 360A and a second heat radiation surface 360B having a surface wider than the other surface are disposed to face each other. The respective power semiconductor elements (the IGBT 310, the IGBT 311, the diode 312, and the diode 313) are disposed to face these heat radiation surfaces. In addition, fins 361 are formed in the first heat radiation surface 360A and the second heat radiation surface 360B.

Three surfaces linked to the first heat radiation surface 360A and the second heat radiation surface 360B facing each other form a sealing surface with a narrow width by the first heat radiation surface 360A and the second heat radiation surface 360B, and the insertion hole 303 is formed in the other surface. The shape of the module case 301 is not necessarily be an exact cuboid, and may be formed a curbed surface with an angle as illustrated in FIG. 3(a).

As illustrated in FIG. 5, besides the module case 301, there is provided the DC positive terminal 340p and the DC negative terminal 340n for the electrical connection with the capacitor module 230. In addition, there is provided the AC terminal 330 to supply AC power to a motor generator.

Besides the module case 301, there are further provided a gate terminal 350 and a gate terminal 351 for the electrical connection with the control-driver circuit board 260. In this embodiment, the gate terminal 350 is connected to the IGBT 310, and the gate terminal 351 is connected to the IGBT 311.

As illustrated in FIG. 4(a), the DC positive terminal 340p, the DC negative terminal 340n, the AC terminal 330, and the gate terminal 350 and the gate terminal 351 are integrally formed as an auxiliary mold body 370 in a state where it is insulated by the terminal insulating portion 306 made of a resin material. The terminal insulating portion 306 is also operated as a supporting member to support the respective terminals. As a resin material used therein, an insulative thermosetting resin or an insulative thermoplastic resin having insulation.

The auxiliary mold body 370 is fixed to the module case 301 by a screw 380 which passes through a screw hole provided in the terminal insulating portion 306 after being metallic-bonded to the primary sealing body 308 and a connection portion 375. A TIG welding may be used for example as the metallic boning between the primary sealing body 308 and the auxiliary mold body 370 in the connection portion 375.

The DC positive terminal 340p and the DC negative terminal 340n are mutually stacked in a state of facing to each other with the terminal insulating portion 306 interposed therebetween, and are formed in a shape expanding in substantially parallel. With such a layout and a shape, the current comes to instantaneously flow in a forward or reverse direction at the time of a switching operation of the power semiconductor element. Therefore, the magnetic fields created by the current are canceled, and thus a low inductance can be realized by such a reaction. Further, the AC terminal 330, the gate terminal 350, and the gate terminal 351 also expand toward the same direction as that of the DC positive terminal 340p and the DC negative terminal 340n.

Figure 7:
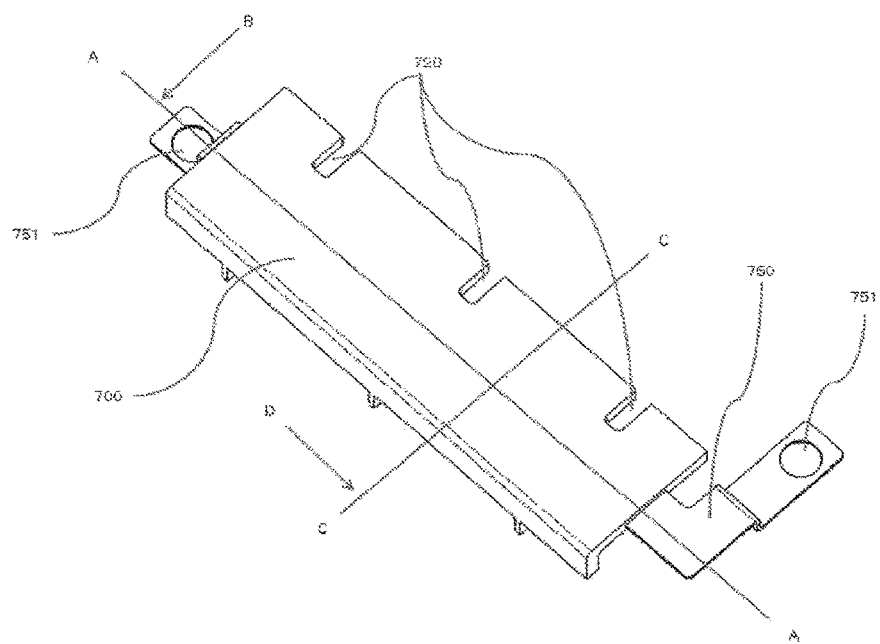
FIG. 7 is a perspective view illustrating an external appearance of a cover portion 700.
Figure 8:
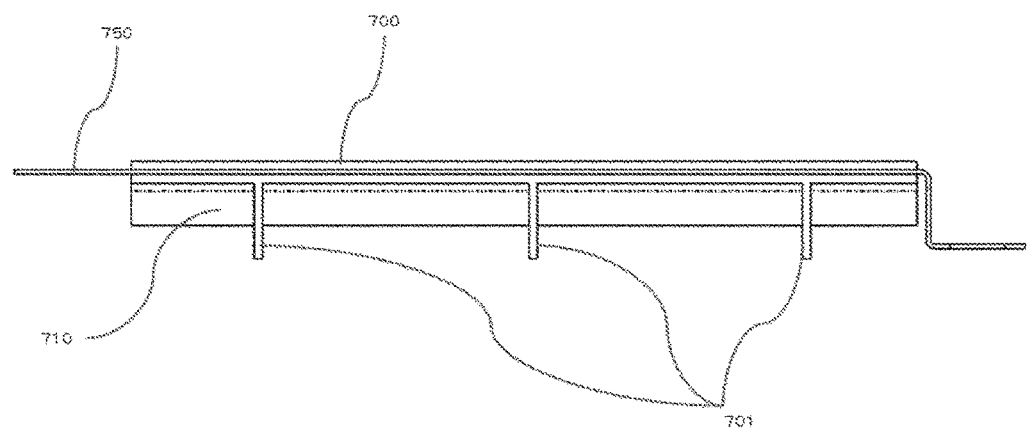
FIG. 8 is a cross-sectional view illustrating the cover portion 700 taken along a line A-A illustrated in FIG. 7 when viewed from a direction B.
Figure 9:
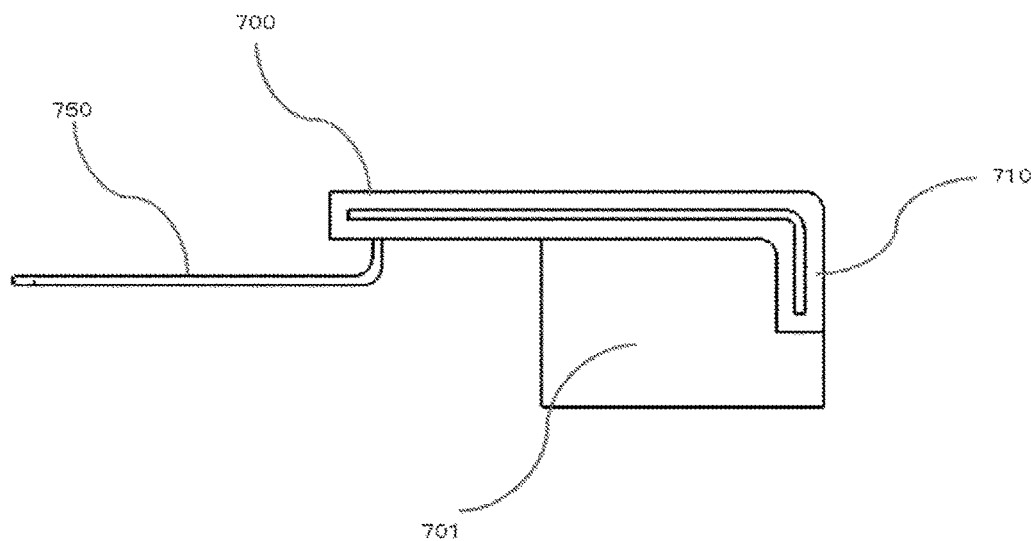
FIG. 9 is a cross-sectional view illustrating the cover portion 700 taken along a line C-C illustrated in FIG. 7 when viewed from a direction D.

A structure of the cover portion 700 used in the power conversion device will be described using FIGS. 7 to 9. FIG. 7 is a perspective view illustrating an external appearance of the cover portion 700. FIG. 8 is a cross-sectional view of the cover portion 700 taken along a line A-A illustrated in FIG. 7 when viewed from a direction B. FIG. 9 is a cross-sectional view of the cover portion 700 taken along a line C-C illustrated in FIG. 7 when viewed from a direction D.

A metal member 750 is made of a material which can shield an electromagnetic noise, for example, an aluminum alloy material. In addition, the metal member 750 is fixed to the cover portion 700. In this embodiment, the metal member 750 is held by an insert molding into the cover portion 700, and may be fixed and held by a snap fitting or a screw fixing. Further, the metal member 750 is partially exposed from the cover portion 700, and forms a screw fixing through-hole 751.

The cover portion 700 is made of an insulating member, for example, a resin material (PBT or PPT). In this embodiment, the cover portion 700 is formed with a concave portion 720 to avoid the position where the gate terminal 350 is disposed. Therefore, the area covering the DC positive terminal 340p and the DC negative terminal 340n of the power semiconductor module is enlarged, and an electromagnetic noise shielding area is enlarged.

In this embodiment, the cover portion 700 is formed with a gate terminal insulating portion 710 to secure an insulating distance between the DC positive terminal 340p of the power semiconductor module and the gate terminal 351 disposed near the DC negative terminal 340n. In addition, there is provided an insulating portion 701 to secure an insulating distance between the DC positive terminal 340p and the DC negative terminal 340n.

Figure 1:
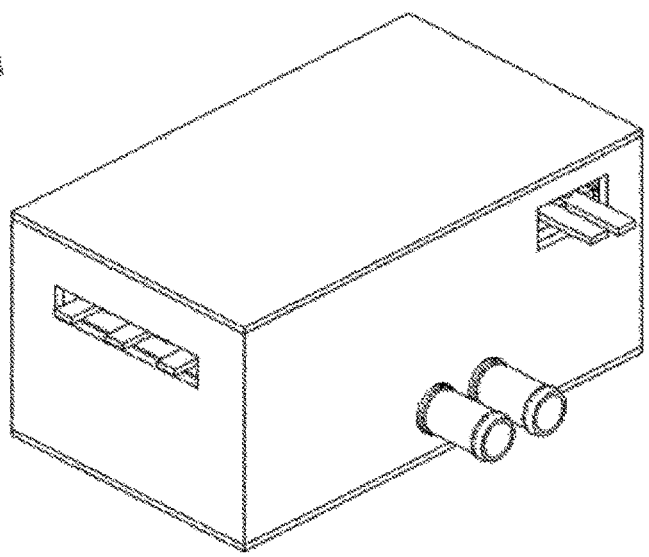
FIG. 1 is a perspective view illustrating an external appearance of a power conversion device 100.
Figure 10:
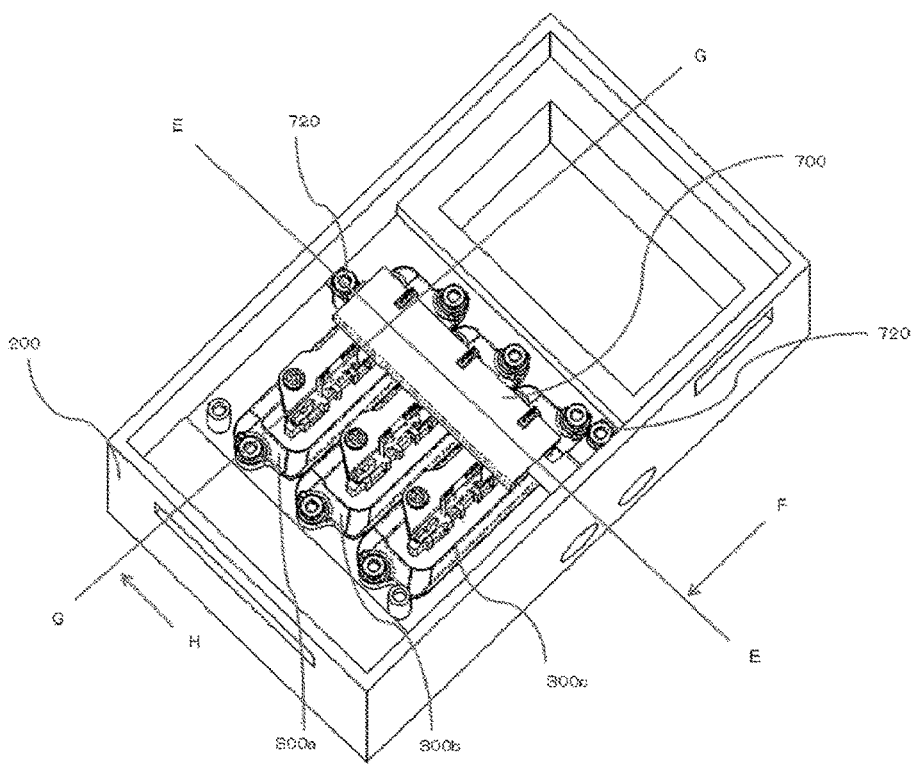
FIG. 10 is a diagram of the power conversion device 100 in which a coolant inflow pump 210in, a coolant outflow pump 210out, a housing lower cover 220, a capacitor module 230, a mold bus bar 240, DC-input bus bars 250p and 250n, a control-driver circuit board 260, and a housing upper cover 270 are removed from the state illustrated in FIG. 1.
Figure 11:
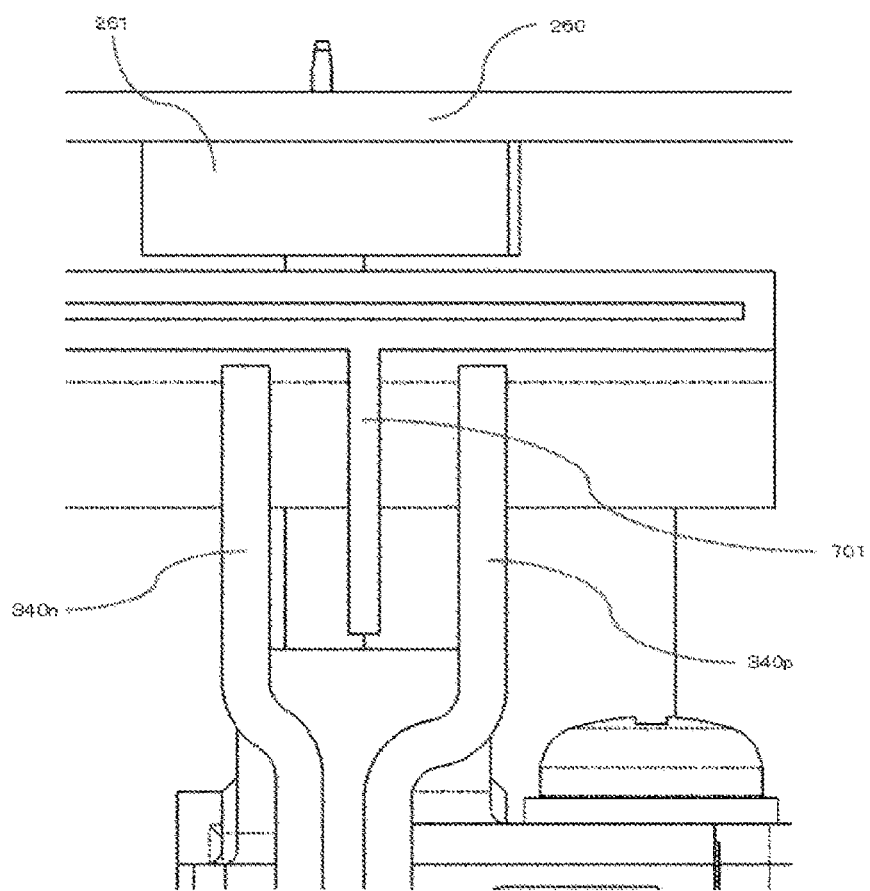
FIG. 11 is an enlarged cross-sectional view illustrating the vicinity of the cover portion 700, in which the control-driver circuit board 260 is added to FIG. 10, the power conversion device 100 is taken along a line E-E illustrated in FIG. 10 when viewed from a direction F.
Figure 12:
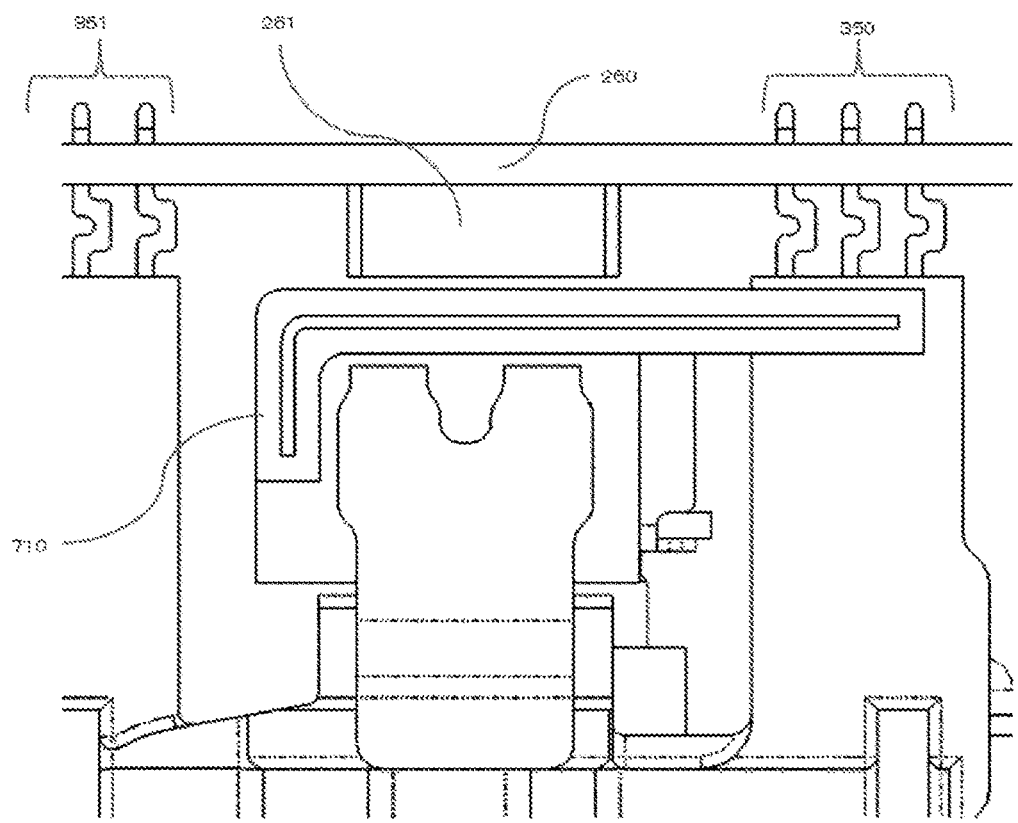
FIG. 12 is an enlarged cross-sectional view illustrating the vicinity of the cover portion 700, in which the control-driver circuit board 260 is added to FIG. 10, the power conversion device 100 is taken along a line G-G illustrated in FIG. 10 when viewed from a direction H.

The layout and the effect of the cover portion 700 used in the power conversion device 100 will be described using FIGS. 10 to 12. FIG. 10 is a diagram of the power conversion device 100 in which a coolant inflow pump 210in, a coolant outflow pump 210out, a housing lower cover 220, a capacitor module 230, a mold bus bar 240, DC-input bus bars 250p and 250n, a control-driver circuit board 260, and a housing upper cover 270 are removed from the state illustrated in FIG. 1. FIG. 11 is an enlarged cross-sectional view illustrating the vicinity of the cover portion 700, in which the control-driver circuit board 260 is added to FIG. 10, the power conversion device 100 is taken along a line E-E illustrated in FIG. 10 when viewed from a direction F. FIG. 12 is an enlarged cross-sectional view illustrating the vicinity of the cover portion 700, in which the control-driver circuit board 260 is added to FIG. 10, the power conversion device 100 is taken along a line G-G illustrated in FIG. 10 when viewed from a direction H.

The current flowing to the DC positive terminal 340p and the DC negative terminal 340n of the power semiconductor modules 300a and 300b varies in the current direction at every switching. Therefore, the direction of magnetic flux generated inside the DC positive terminal 340p and the DC negative terminal 340n varies. Since the direction of magnetic flux varies at this time, the magnetic field and the electric field are generated in series. A series of waves of the magnetic field and the electric field becomes the electromagnetic noises. In addition, at this time, the variation in magnetic flux becomes increased as the DC positive terminal 340p and the DC negative terminal 340n are separated from away in distance.

When the variation in magnetic field occurs, the inductance varies. Therefore, when the amount of variation in magnetic flux is increased, the amount of variation in inductance is increased. In other words, it can be said that the electromagnetic noises are generated from the DC positive terminal 340p and the DC negative terminal 340n where the amount of variation in inductance is increased.

When the magnetic field steeply varies in the vicinity of the conductor, an eddy current is generated on the conductor in an axis of the magnetic flux passing through the conductor, and the generated eddy current causes the magnetic flux in a direction canceling the base magnetic flux. Since the magnetic flux is generated in a direction canceling the base magnetic flux, the electromagnetic noise is shielded.

The generation of the magnetic flux in a direction canceling the base magnetic flux means that the inductance is reduced. In other words, the DC positive terminal 340p and the DC negative terminal 340n where the inductance varies greatly are covered by the metal member 750, and the electromagnetic noises are shielded by reducing the amount of variation in inductance.

When approaching another conductor, the DC positive terminal 340p and the DC negative terminal 340n each are short-circuited because there is no insulation. The metal member 750 is held by the cover portion 700 made of an insulating member in order to secure the insulation with respect to the metal member 750 which covers the DC positive terminal 340p and the DC negative terminal 340n. In addition, the cover portion 700 includes an insulating portion between the DC positive terminal 340p, the DC negative terminal 340n, and a conductor other than the approaching metal member 750 in order to also secure the insulation with respect to the conductor other than the metal member 750 which approaches the DC positive terminal 340p and the DC negative terminal 340n.

In this embodiment, there is provided an insulating portion 710 to secure the insulating distance with respect to the gate terminal 351 which approaches the DC positive terminal 340p and the DC negative terminal 340n. In addition, there is provided an insulating portion 701 to secure the insulating distance between the DC positive terminal 340p and the DC negative terminal 340n.

When the eddy current is generated in the metal member 750, the potential in the metal member 750 is changed and charged. In a case where the charged metal member 750 approaches the other conductor, an electrostatic discharge occurs and causes an erroneous operation or a shirt circuit. In addition, a charged object attracts foreign matters such as dust, and causes a short circuit or a current leakage.

Therefore, the metal member 750 is necessarily prevented from being charged. For the reason, there is a need to fix the metal member 750 while partially having a conduction portion. In this embodiment, the metal member 750 is fixed to the housing case 200 as illustrated in FIG. 10. Therefore, the potential in the metal member 750 can be leaked out to the housing case 200, and thus the metal member 750 can be prevented from being charged.

In order to shield the electromagnetic noises as much as possible, the area of the metal member 750 may be increased wide to shield the DC positive terminal 340p and the DC negative terminal 340n where the electromagnetic noises are generated. In this embodiment, the metal member 750 and the cover portion 700 are formed with the concave portion 720 to avoid the position where the gate terminal 350 is disposed, and the area to cover the DC positive terminal 340p and the DC negative terminal 340n of the power semiconductor module is formed wide. Therefore, the electromagnetic noise shielding area is increased.

A driver circuit board mounted with a drive circuit to drive the power semiconductor module and a circuit element are likely to be erroneously operated by the electromagnetic noises. Therefore, there is a need to protect these components from the source of the electromagnetic noises. In this embodiment, the control-driver circuit board 260 includes a drive circuit which drives the power semiconductor modules 300a to 300c, and disposed at a position facing the power semiconductor modules 300a to 300c with the cover portion 700 interposed therebetween. Further, the control-driver circuit board 260 includes a circuit element 261 mounted in the surface on a side where the cover portion 700 is disposed. Generally, in such a case, the distance from the control-driver circuit board 260 and the mounted circuit element 261 to the DC positive terminal 340p and the DC negative terminal 340n of the power semiconductor module serving as an electromagnetic noise source is closed, and thus there is a strong possibility of an erroneous operation.

However, in this embodiment, the cover portion 700 is interposed between the control-driver circuit board 260 and the mounted circuit element 261, and the DC positive terminal 340p and the DC negative terminal 340n of the power semiconductor module serving as an electromagnetic noise source. Therefore, the control-driver circuit board 260 and the mounted circuit element 261 can be disposed approach the DC positive terminal 340p and the DC negative terminal 340n of the power semiconductor module while shielding the electromagnetic noise. With this configuration, the height of the back surface of the power conversion device can be reduced, and the power conversion device can be miniaturized.

The power semiconductor module is mounted in the power conversion device, and the number of times of mounting may be increased in some cases. In this embodiment, the power conversion device 100 is mounted with total three modules (the U-phase power semiconductor module 300a, the V-phase power semiconductor module 300b, and the W-phase power semiconductor module 300c). Since the electromagnetic noises are generated from the DC positive terminal 340p and the DC negative terminal 340n of each of the power semiconductor modules 300a to 300c, there is a need to shield the electromagnetic noises of each of the power semiconductor modules 300a to 300c. In this embodiment, the cover portion 700 is configured to simultaneously cover the DC positive terminals 340p and the DC negative terminals 340n of the U-phase power semiconductor module 300a, the V-phase power semiconductor module 300b, and the W-phase power semiconductor module 300c. Therefore, it is possible to shield the electromagnetic noises generated from the DC positive terminal 340p and the DC negative terminal 340n of each of the power semiconductor modules 300a to 300c without a gap.

REFERENCE SIGNS LIST

100 . . . power conversion device, 200 . . . housing case, 200a . . . lower surface of housing case, 200b . . . upper surface of housing case, 210in . . . coolant inflow pump, 210out . . . coolant outflow pump, 220 . . . housing lower cover, 230 . . . capacitor module, 240 . . . mold bus bar, 250p . . . DC-input bus bar, 250n . . . DC-input bus bar, 260 . . . control-driver circuit board, 261 . . . circuit element, 270 . . . housing upper cover, 300a U-phase power semiconductor module, 300b V-phase power semiconductor module, 300c W-phase power semiconductor module, 301 . . . module case, 302 . . . second sealing resin, 303 . . . insertion hole, 304 . . . flange, 305 . . . first sealing resin, 306 . . . terminal insulating portion, 307 . . . insulating member, 308 . . . primary sealing body, 310 . . . IGBT, 311 . . . IGBT, 312 . . . diode, 313 . . . diode, 320 . . . conductor plate, 321 . . . conductor plate, 322 . . . conductor plate, 323 . . . conductor plate, 330 . . . AC terminal, 340p . . . DC positive terminal, 340n . . . DC negative terminal, 350 . . . gate terminal, 351 . . . gate terminal, 360A . . . first heat radiation surface, 360B . . . second heat radiation surface, 361 . . . fin, 370 . . . auxiliary mold body, 375 . . . connection portion, 380 screw, 700 . . . cover portion, 701 . . . insulating portion, 710 . . . gate terminal insulating portion, 720 . . . concave portion, 750 . . . metal member, 751 . . . screw fixing through-hole

The invention claimed is:

1. A power conversion device, comprising: a power semiconductor module that converts a DC current into an AC current and includes a DC positive terminal and a DC negative terminal; a cover portion that includes a first insulating portion, the first insulating portion being disposed with respect to another conductor that approaches each of the DC positive terminal and the DC negative terminal, wherein the cover portion holds a metal member that covers the DC positive terminal and the DC negative terminal; and a driver circuit board in which a drive circuit is mounted to drive the power semiconductor module, wherein the driver circuit hoard is disposed at a position to face the power semiconductor module with the cover portion interposed there between, the driver circuit board includes a circuit element mounted in a surface on a side where the cover portion is disposed.

2. The power conversion device according to claim 1, wherein the cover portion includes the first insulating portion disposed between the DC positive terminal and the DC negative terminal.

3. The power conversion device according to claim 1, wherein a part of the metal member is fixed to a housing.

4. The power conversion device according to claim 1, wherein the power semiconductor module includes a power semiconductor element and a gate terminal that transfers a signal to control the power semiconductor element,
wherein the DC positive terminal, the DC negative terminal, and the gate terminal protrude toward the same direction, and
wherein the cover portion forms a concave portion in which the gate terminal is disposed.

5. The power conversion device according to claim 1, wherein the power semiconductor module includes a plurality of power semiconductor modules, and
wherein the metal member is configured to cover a DC positive terminal and a DC negative terminal of the plurality of power semiconductor modules.

* * * * *